US010971343B2

(12) United States Patent
Vladimir et al.

(10) Patent No.: US 10,971,343 B2
(45) Date of Patent: Apr. 6, 2021

(54) APPARATUS FOR MONITORING PROCESS CHAMBER

(71) Applicant: Samsung Electronics Co., Ltd., Suwon-si (KR)

(72) Inventors: Protopopov Vladimir, Suwon-si (KR); Ki Ho Hwang, Seoul (KR); Doug Yong Sung, Seoul (KR); Se Jin Oh, Hwaseong-si (KR); Kul Inn, Seongnam-si (KR); Sung Ho Jang, Hwaseong-si (KR); Yun Kwang Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/262,024

(22) Filed: Jan. 30, 2019

(65) Prior Publication Data

US 2019/0164731 A1    May 30, 2019

Related U.S. Application Data

(63) Continuation of application No. 15/260,910, filed on Sep. 9, 2016, now Pat. No. 10,229,818.

(30) Foreign Application Priority Data

Jan. 27, 2016    (KR) .................. 10-2016-0009899

(51) Int. Cl.
*G06K 9/00* (2006.01)
*H01J 37/32* (2006.01)
*H04N 5/225* (2006.01)

(52) U.S. Cl.
CPC .. *H01J 37/32935* (2013.01); *H01J 37/32715* (2013.01); *H01J 37/32972* (2013.01); *H04N 5/2252* (2013.01)

(58) Field of Classification Search
CPC .......... G02B 5/085; G06T 2207/30148; G06T 7/0008
See application file for complete search history.

(56) References Cited

U.S. PATENT DOCUMENTS 6,084,716 A * 7/2000 Sanada ............ G01N 21/95607
356/237.5
6,171,451 B1 * 1/2001 Miley .................... B82Y 30/00
204/173
(Continued)

FOREIGN PATENT DOCUMENTS

JP    2011-228386 A    11/2011
JP    2012-222225 A    11/2012
(Continued)

*Primary Examiner* — Guillermo M Rivera-Martinez
(74) *Attorney, Agent, or Firm* — Harness, Dickey & Pierce, P.L.C.

(57) ABSTRACT

An apparatus for monitoring an interior of a process chamber including a process chamber including a chamber body and a view port defined in the chamber body, a cover section including a pinhole in one end, the cover section disposed to correspond to an end portion of the view port, the cover section having a first length in a direction toward a center point of the process chamber, and a sensing unit inserted into the view port to monitor the interior of the process chamber through the pinhole, a region in the process chamber to be sensed by the sensing unit determined based on the first length may be provided.

20 Claims, 14 Drawing Sheets

(56) References Cited

U.S. PATENT DOCUMENTS

| | | |
|---|---|---|
| 7,061,184 B2 | 6/2006 | Kim et al. |
| 7,974,067 B2 | 7/2011 | Ito et al. |
| 8,416,509 B2 | 4/2013 | Yi et al. |
| 2001/0016293 A1* | 8/2001 | Nishi ................ G03F 7/70691 430/22 |
| 2002/0027648 A1* | 3/2002 | Van Der Laan .... G03F 7/70133 355/71 |
| 2003/0030810 A1* | 2/2003 | Sebok .................. G01N 15/147 356/436 |
| 2004/0061042 A1* | 4/2004 | Almogy ............. G01N 21/8806 250/208.1 |
| 2004/0069408 A1* | 4/2004 | Cheng ............. H01J 37/32458 156/345.25 |
| 2006/0181700 A1* | 8/2006 | Andrews ................ G01N 21/21 356/237.2 |
| 2008/0200100 A1* | 8/2008 | Takahashi ............... B24B 9/065 451/44 |
| 2010/0111440 A1* | 5/2010 | Chai ..................... G06T 3/0018 382/275 |
| 2010/0171955 A1 | 7/2010 | Suga et al. |
| 2010/0200767 A1* | 8/2010 | Yi ............................. G01J 3/02 250/423 R |
| 2010/0296096 A1* | 11/2010 | Horvath ............. G01B 11/0625 356/446 |
| 2010/0323124 A1 | 12/2010 | Vartabedian et al. |
| 2011/0007161 A1* | 1/2011 | Batchko .................... G02B 3/14 348/144 |
| 2011/0177624 A1* | 7/2011 | Camm ................... C21D 11/00 438/7 |
| 2012/0192398 A1* | 8/2012 | Vo ....................... H01J 37/3244 29/428 |
| 2013/0193108 A1* | 8/2013 | Zheng .................... C23C 14/54 216/59 |
| 2014/0253092 A1 | 9/2014 | Jeon et al. |
| 2014/0347465 A1* | 11/2014 | Takahashi ............ G06T 7/0004 348/87 |
| 2015/0204317 A1* | 7/2015 | Adair ................. F04B 11/0091 417/279 |
| 2016/0145764 A1* | 5/2016 | Takanashi ............... C30B 15/26 117/15 |
| 2017/0150015 A1* | 5/2017 | Salazar ................... G01F 17/00 |

FOREIGN PATENT DOCUMENTS

| | | |
|---|---|---|
| KR | 10-0247917 B1 | 3/2000 |
| KR | 10-2007-0035346 A | 3/2007 |
| KR | 10-0963518 B1 | 6/2010 |
| KR | 10-1012090 B1 | 2/2011 |
| KR | 10-2015-0025903 A | 3/2015 |
| KR | 10-1520453 B1 | 5/2015 |

\* cited by examiner

APPARATUS FOR MONITORING PROCESS CHAMBER

This application is a continuation of U.S. application Ser. No. 15/260,910, filed on Sep. 9, 2016, which claims priority under 35 U.S.C. § 119 to Korean Patent Application No. 10-2016-0009899, filed on Jan. 27, 2016 in the Korean Intellectual Property Office, the entire contents of each of the above-referenced applications are hereby incorporated by reference.

BACKGROUND

1. Technical Field

The present inventive concepts relate to apparatuses for monitoring a process chamber.

2. Description of the Related Art

In a plasma etching apparatus for manufacturing semiconductor components or LCD components, a plasma etching process using an RF power is performed. In particular, in the wafer manufacturing process, a silicon oxide film is used to form an interlayer insulating film, polysilicon doped with impurity is used to form a capacitor, and a dry etching process using plasma is used to perform patterning of the silicon oxide film or the polysilicon layer.

As the dry etching process, there is a transformer coupled plasma (TCP) etching method that uses a high density plasma (HDP) source system. In a TCP etching apparatus using the TCP etching method, a wafer is mounted on a bottom of an interior of a chamber, a process gas injection tube for injecting the process gas into the chamber is installed on one side of the chamber, and when injecting the process gas into the chamber and simultaneously generating the RF power, plasma is generated in the interior of the chamber to etch a top surface of the wafer.

SUMMARY

An aspect of the present inventive concepts provides an apparatus for monitoring a process chamber to check presence or absence of abnormality of the process in a non-penetration monitoring manner, while not affecting execution of the process.

Another aspect of the present inventive concepts provides an apparatus for monitoring a process chamber that is capable of monitoring both a central portion and an outer portion of the process chamber.

Still another aspect of the present inventive concepts provides an apparatus for monitoring a process chamber to monitor an extent of distribution of process substance at a wafer surface level of the process chamber.

However, aspects of the present inventive concepts are not restricted to the ones set forth herein. The above and other aspects of the present inventive concepts that have not been mentioned will become more apparent to one of ordinary skill in the art to which the present inventive concepts pertains by referencing the detailed description of the present inventive concepts given below.

According to an example embodiment of the present inventive concepts, an apparatus for monitoring an interior of a process chamber includes a process chamber including a chamber body and a view port defined in the chamber body, a cover section including a pinhole in one end, the cover section disposed to correspond to an end portion of the view port, the cover section having a first length in a direction toward a center of the process chamber, and a sensing unit inserted into the view port to monitor the interior of the process chamber through the pinhole, a region in the process chamber to be sensed by the sensing unit determined based on the first length.

According to an example embodiment of the present inventive concepts, an apparatus for monitoring an interior of a process chamber includes a process chamber including a chamber body, the chamber body including a first view port and a second view port defined therein, a first cover section including a first pinhole, the first cover section disposed to correspond to an end portion of the first view port, a first sensing unit inserted into the first view port to monitor a first sensing region in the interior of the process chamber through the first pinhole, a second cover section including a second pinhole, the second cover section disposed to correspond to an end portion of the second view port, and a second sensing unit inserted into the second view port to monitor a second sensing region in the interior of the process chamber through the second pinhole, the second sensing region being different from the first sensing region.

According to an example embodiment of the present inventive concepts, an apparatus for monitoring an interior of a process chamber includes a process chamber including a housing space defined therein, one or more image pickup units each configured to monitor a distribution status of a process substance in the housing space, the one or more image pickup units each configured to change a monitoring region in the process chamber by adjusting a focal distance thereof, and one or more processors configured to obtain a density distribution of the process substance on a bottom surface of the housing space, by performing one or more arithmetic operations using monitoring results from the one or more image pickup units.

According to an example embodiment of the present inventive concepts, an apparatus for monitoring an interior of a process chamber includes a process chamber including a chamber body and at least one view port defined in the chamber body, at least one cover structure coupled into the view port, the cover structure including a pinhole at one end thereof, the cover structure configured to move forward or backward with respect to an inner wall of the chamber body, the cover structure having a length in a direction toward a center of the process chamber, and at least one sensor accommodated in the cover structure to monitor the interior of the process chamber through the pinhole, a region in the process chamber to be sensed by the sensor determined according to a focal distance of the sensor, the focal distance of the sensor determined based on a distance between the pinhole and the sensor.

BRIEF DESCRIPTION OF THE DRAWINGS

The above and other aspects and features of the present inventive concepts will become more apparent by describing in detail some example embodiments thereof with reference to the attached drawings, in which.

DETAILED DESCRIPTION

A process chamber described below may be a process chamber that performs a plasma process. However, the present inventive concepts are not limited thereto. The present inventive concepts will be described using a process chamber that is used when performing the plasma process as an example. The plasma process may be a process that uses a plasma substance during the manufacturing process of, for example, a semiconductor device, a display device, and a printed circuit board (PCB). The plasma process may refer to, for example, a dry etching process, a sputtering process, a dry clean process, a dry ashing process, or a plasma enhanced chemical vapor deposition (PECVD) process.

The process chamber according to the present inventive concepts may be utilized when performing the plasma process as described above. The process chamber may have various shapes and/or may include various materials as desired, without being limited to the shapes and materials described below. The process chamber and the apparatus for monitoring the process chamber according to the present inventive concepts described with reference to the drawings are merely some examples.

First, a process chamber and an apparatus for monitoring the process chamber according to an example embodiment of the present inventive concepts will be described referring to FIGS. 1 through 6.

Figure 1:
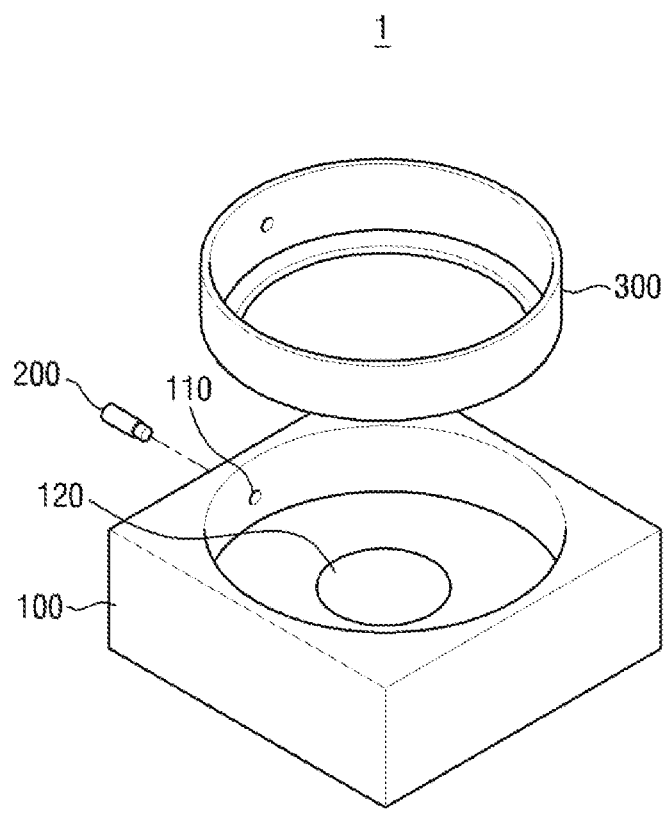
FIG. 1 is an exploded perspective view of an apparatus for monitoring a process chamber according to an example embodiment of the present inventive concepts.
Figure 2:
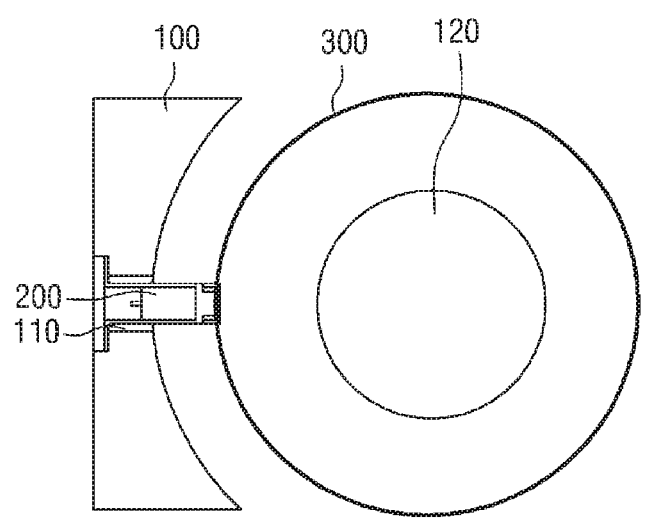
FIGS. 2 and 3 are partially cross-sectional views of the apparatus for monitoring the process chamber according to some example embodiments of the present inventive concepts.
Figure 3:
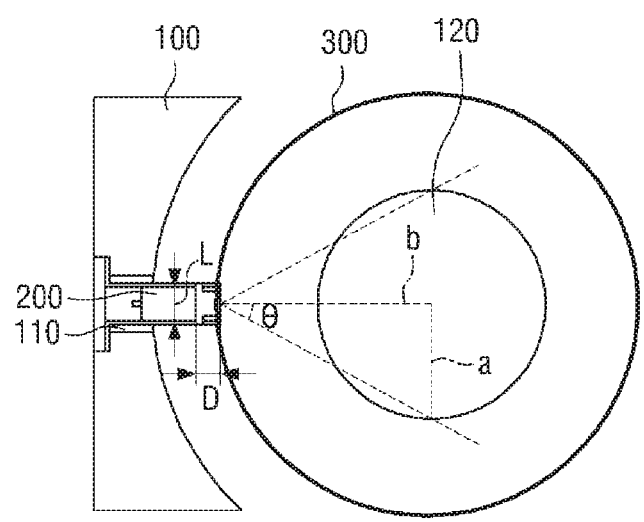
Figure 4:
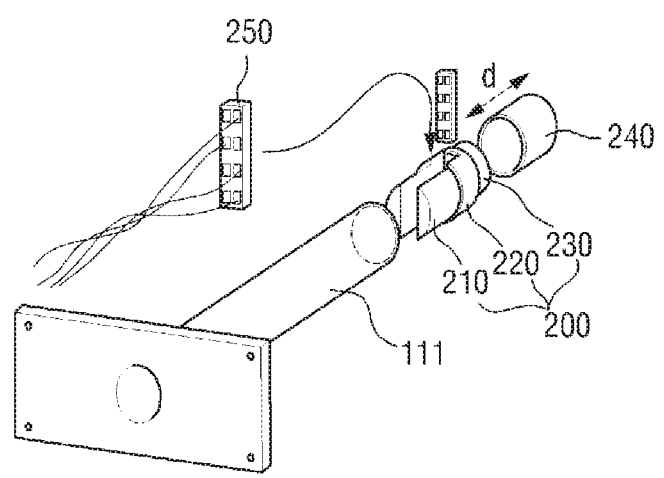
FIG. 4 is an exploded perspective view illustrating a part of the apparatus for monitoring the process chamber according to an example embodiment of the present inventive concepts.
Figure 5:
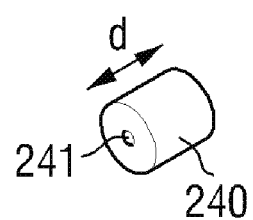
FIG. 5 is a perspective view illustrating a front portion of a cover section of FIG. 4.
Figure 6:
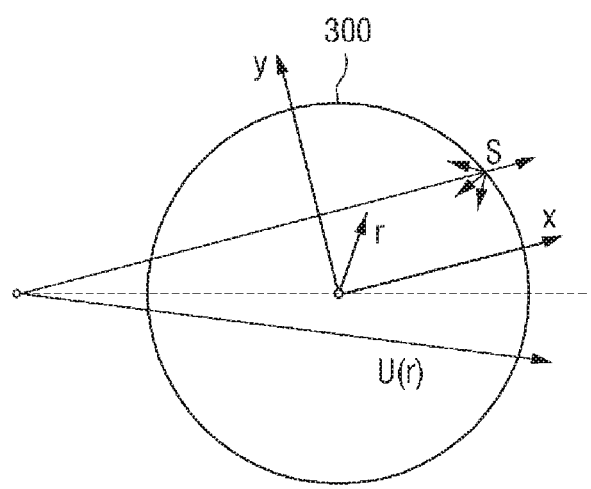
FIG. 6 is a diagram for explaining a method of performing an arithmetic operation of the distribution of process substance in the apparatus for monitoring the process chamber according to an example embodiment of the present inventive concepts.

FIG. 1 is an exploded perspective view of an apparatus for monitoring the process chamber according to an example embodiment of the present inventive concepts. FIGS. 2 and 3 are partially cross-sectional views of the apparatus for monitoring the process chamber according to some example embodiments of the present inventive concepts. FIG. 4 is an exploded perspective view illustrating a part of the apparatus for monitoring the process chamber according to an example embodiment of the present inventive concepts. FIG. 5 is a perspective view illustrating a front portion of a cover section of FIG. 4. FIG. 6 is a diagram for explaining a method of performing an arithmetic operation of the distribution of process substances in the apparatus for monitoring the process chamber according to an example embodiment of the present inventive concepts.

Referring to FIG. 1, an apparatus 1 for monitoring a process chamber according to an example embodiment of the present inventive concepts includes a chamber body 100, a view port 110, a substrate support 120, a main body 200, a liner 300 and a like.

The chamber body 100 may be formed to include a housing space capable of housing the process substance therein. For example, a cylindrical housing space may be formed within the chamber body 100, but the present inventive concepts are not limited thereto. In some example embodiments, the housing space formed inside the chamber body 100 may have a polygonal pillar shape.

The substrate support 120 may be formed on a bottom surface of the chamber body 100, and a substrate, which may be used in the manufacturing process of the semiconductor device, the display device, the PCB, or the like, may be disposed on the substrate support 120. For example, a wafer may be disposed on the substrate support 120.

Because a process substance (e.g., plasma substance) may be housed inside the chamber body 100 and the process may be performed, the chamber body 100 may be formed of a material that does not react with the process substance (e.g., plasma substance). The chamber body 100, for example, may be formed of metal. The chamber body 100, for example, may be formed of copper (Cu) or aluminum (Al), but the present inventive concepts are not limited thereto.

The chamber body 100 may be, for example, a place where an etching process is performed, and serves to provide a sealed housing space so that a smooth etching process is performed. The process gas for the etching process may flow into the chamber body 100 from an outside or may be discharged to the outside, in accordance with the progress of the process.

The view port 110 may be formed on one side wall of the chamber body 100. The view port 110, for example, may include a cylindrical hole, but the present inventive concepts are not limited thereto. For example, the view port 110 may have various shapes, and the view port 110 may have any structure that can check a distribution status of the process gas or the process substance in the chamber body 100.

The view port 110 may have various structures according to structures of a sensing device to be inserted therein so that the sensing device can check a process progress status or the distribution status of the process substance in the chamber body 100 through the view port 110. Thus, the view port 110 may be formed to penetrate through one side wall of the chamber body 100. Further, the shape of the view port 110 may vary according to the structure of the sensing device to be inserted therein.

The view port 110, for example, may be formed of quartz or sapphire, but the present inventive concepts are not limited thereto. That is, the view port 110 may be installed in the one side wall of the chamber body 100. At this time, the length of the hole formed in the view port 110 may be determined in accordance with the surface wave resonance theory.

The main body 200 may be inserted into the view port 110. Various sensing devices may be included in the main body 200. The main body 200 may protect the sensing devices. In some example embodiments, the sensing devices may be directly inserted into the view port 110 without using the main body 200.

The main body 200 may have a cylindrical shape. A part of the view port 110 also may have a cylindrical shape. For example, the main body 200 may be formed in the shape similar to the view port 110 so that the main body 200 can be inserted into the view port 110.

The liner 300 may be formed within the chamber body 100. For example, the liner 300 may be formed in a shape corresponding to the housing space in the chamber body 100. The inner surface of the liner 300 may be formed in a cylindrical shape so that a light reflectance is substantially the same regardless of positions on the cylindrical shape. Thus, influences on the sensing device other than the process gas or the process substance may be mitigated or prevented when monitoring the internal process status of the chamber body 100 through the sensing device installed in the main body 200.

Although the liner 300 may be formed to come into contact with the inner surface of the chamber body 100, the present inventive concepts are not limited thereto. If the liner 300 is affixed to an interior of the chamber body 100, an occurrence of shaking may be mitigated or prevented when the sensing device installed in the main body 200 monitors the interior of the chamber body 100.

The liner 300, for example, may be formed of metal. The liner 300, for example, may be formed of copper (Cu) or aluminum (Al), but the present inventive concepts are not limited thereto.

Referring to FIGS. 2 through 5, a rear end of the main body 200 is coupled to a view port fixing section 111, and a front end of the main body 200 is coupled to the cover section 240. A coupled structure of the view port fixing section 111, the main body 200, and the cover section 240 may be inserted and affixed into the view port 110.

For example, the main body 200 may include a coupling section 210, a fixing section 220, and an insertion section 230. The coupling section 210 may be inserted and affixed into the view port fixing section 111. For example, the end portion of the view port fixing section 111 may be formed in a cylindrical shape, and an end portion of the coupling section 210 also may be formed in the cylindrical shape so that the end portion of the coupling section 210 may be inserted and affixed into the end portion of the view port fixing section 111. However, the present inventive concepts are not limited thereto, and the end portion of the view port fixing section 111 and the end portion of the coupling section 210 may be formed in a shape other than a cylindrical shape and may be coupled to each other.

A sensing unit 250 may be affixed to or inserted into the fixing section 220. For example, a groove may be formed in the fixing section 220, and the sensing unit 250 may be inserted and/or affixed into the groove of the fixing section 220. However, the present inventive concepts are not limited thereto, and various coupling methods capable of coupling the sensing unit 250 in the fixing section 220 may be used.

The sensing unit 250, for example, may include a charge coupled device (CCD) sensor or a CMOS sensor. The sensing unit 250, for example, may include a linear array camera, a CMOS camera or the like. The sensing unit 250 may monitor the internal process status of the chamber body 100 through a pinhole 241 formed on the front surface of the cover section 240.

The insertion section 230 may be inserted and coupled into the cover section 240. An end portion of the insertion section 230 may have a cylinder shape, but the present inventive concepts are not limited thereto. The end portion of the insertion section 230 may be formed in a shape that can be inserted and coupled into the cover section 240. However, the insertion section 230 may be coupled to the cover section 240 in other ways.

The cover section 240 may be disposed to correspond to the end portion of the view port 110, and may have a length d in a direction toward a center of the chamber body 100. A pinhole 241 may be formed on a front surface of the cover section 240 that faces the center of the chamber body 100. In some example embodiments, the length d may refer to a distance between the pinhole 241 and the sensing unit 250.

The cover section 240 may be coupled to the insertion section 230 of the main body 200 and may be disposed in front of a monitoring direction of the sensing unit 250 affixed or coupled to the interior of the main body 200. The focal distance of the sensing unit 250 may change depending on the length d of the cover section 240. In some example embodiments, the focal distance may change based on a distance between the pinhole 241 and the sensing unit 250. For example, in the case that the sensing unit 250 is a linear array camera, a position of the camera lens of the linear array camera may be determined or adjusted by the length d of the cover section 240, and thus a focal distance of the linear array camera may vary depending on the length d. Accordingly, when the length d of the cover section 240 has a first value, a sensing region of the sensing unit 250 may be a first region in the chamber body 100, and when the length d of the cover section 240 has a second value other than the first value, the sensing region of the sensing unit 250 may be changed to a second region in the chamber body 100. The first region and the second region may mean different regions from each other. The length d of the cover section 240 may be determined on the basis of the surface wave resonance theory.

In some example embodiments, the first region may be determined according to a first focal distance of the sensing unit 250 and a first length of the cover section 240 protruding into the chamber body 100. The first focal distance of the sensing unit 250 may be determined based on a first distance between the pinhole 241 and the sending unit 250. The second region may be determined according to a second focal distance of the sensing unit 250 and a first length of the cover section 240 protruding into the chamber body 100. The second focal distance of the sensing unit 250 may be determined based on a second distance between the pinhole 241 and the sensing unit 250. The cover section 240 may be configured to move to determine the focal distance (e.g., the first and second focal distances) of the sensing unit 250.

Accordingly, by properly setting the length d of the cover section 240, a monitoring range of the substrate disposed on the substrate support 120 in the chamber body 100 may be set. When the process substance or the process gas flows onto the substrate disposed on the substrate support 120, the entire surface of the substrate should exist within the monitoring range to check whether the process substance and the process gas is properly distributed on the surface of the substrate and the process is smoothly performed.

In the apparatus 1 for monitoring the process chamber according to the present inventive concepts, the entire surface of the substrate can be made exist within the monitoring range by properly adjusting the length d of the cover section 240, which includes the pinhole 241 defined at one end thereof.

Further, the cover section 240 may be formed to protrude from an inner wall of the liner 300. For example, the cover section 240 may extend toward the center of the chamber body 100 from a position at which the inner wall of the liner 300 is provided. Thus, because the cover section 240 may be exposed to the process substance or the process gas flowed into the chamber body 100, the cover section 240 may be formed of a material that does not react with the process substance or the process gas flowed into the chamber body 100.

For example, the cover section 240 may be formed of metal. The cover section 240, for example, may be formed of copper (Cu) or aluminum (Al), but the present inventive concepts are not limited thereto.

The sensing unit 250 may monitor the internal process status of the chamber body 100 through the pinhole 241 at a particular portion in the chamber body 100. The particular portion may not be a surface region of a substrate disposed on the substrate support 120. Transformation and arithmetic operations on the result monitored by the sensing unit 250 may be performed to obtain the process status at the substrate surface level disposed on the substrate support 120. Accordingly, whether the process substance or the process gas is uniformly distributed at the surface level of the substrate disposed on the substrate support 120 may be checked, and the process status at the substrate surface level may be determined.

Referring to FIG. 3, in the apparatus 1 for monitoring the process chamber according to an example embodiment of the present inventive concepts, a wafer may be disposed on the substrate support 120 in the chamber body 100. For example, when a radius of the wafer is set to "a" and a distance from the center point of the substrate support 120 to the pinhole 241 is set to "b", a sensing angle 20 of the sensing unit 250 is arc tan (a/b)/π×180×2°.

For example, when a width of the sensing unit 250 disposed in the main body 200 is set to "L" and the distance from the end portion of the sensing unit 250 to the pinhole 241 is set to "D", the distance D between the sensing unit 250 and pinhole 241 is (b×L)/(a×2).

Referring to FIG. 6, the transformation and arithmetic operations on the monitoring result of the sensing unit 250 to achieve data about the process status at the substrate surface level may be performed using the Abel transformation. The following [Formula 1] and [Formula 2] may be used.

$$F(y) = A[U(r)] = 2 \int_y^\infty \frac{U(r)}{\sqrt{r^2 - y^2}} r dr \qquad \text{[Formula 1]}$$

$$U(r) = A^{-1}[F(y)] = \frac{1}{\pi} \int_y^\infty \frac{dF}{dy} \frac{dy}{\sqrt{y^2 - r^2}} \qquad \text{[Formula 2]}$$

Here, F(y) is a value measured by monitoring in the sensing unit 250, U(r) is a calculated value obtained by performing the Abel transformation to the data about the process status at the substrate surface level. Dispersion about the process status at the substrate surface level may be determined using the values of U(r).

In FIG. 6, [Formula 1] and [Formula 2] may be applied to the diffuse reflectance (S), assuming that the reflectivity of the liner 300 is uniform regardless of position on the liner 300.

According to some example embodiments of the present inventive concepts, a spatial density of the process substance may be monitored using the optical measurement such as an optical emission spectrometer (OES) by disposing the sensing unit 250 in a non-contact manner, when performing the process (e.g., a plasma process). Further, the presence or absence of abnormality in the process at the time of performing the process (e.g., the plasma process) may be checked without affecting the process.

Further, according to some example embodiments of the present inventive concepts, the interior of the chamber body 100 at the time of performing the process (e.g., the plasma process) may be monitored by adjusting the thickness d of the cover section 240a formed with the pinhole 241, and the surface of the substrate disposed on the substrate support 120 may be monitored.

Further, according to some example embodiments of the present inventive concepts, because the number of components of the apparatus for monitoring the internal process status of the chamber body 100 may be reduced, and thus a probability of measurement error may be reduced. As the number of components constituting the apparatus increases, the probability of measurement error also may increase while controlling the components. Accordingly, reducing the number of components that constitute the monitoring device may be desired.

An apparatus for monitoring a process chamber according to another example embodiment of the present inventive concepts will be described below.

Figure 7:
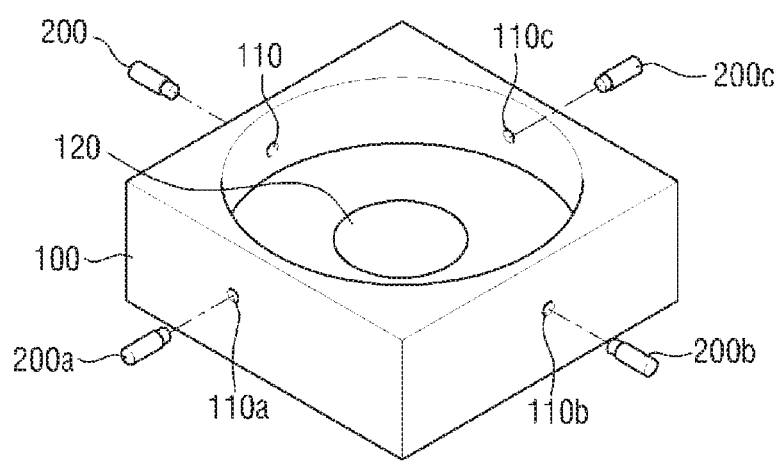
FIG. 7 is a perspective view of the apparatus for monitoring the process chamber according to an example embodiment of the present inventive concepts.

FIG. 7 is a perspective view of an apparatus for monitoring the process chamber according to an example embodiment of the present inventive concepts. For convenience of explanation, the description of the substantially same parts as the aforementioned apparatus for monitoring the process chamber will not be provided.

Referring to FIG. 7, an apparatus 2 for monitoring a process chamber includes a plurality of view ports 110, 110a, 110b and 110c in the chamber body 100, and includes a plurality of main bodies 200, 200a, 200b and 200c corresponding to each of the plurality of view ports 110, 110a, 110b and 110c.

A sensing device may be included in each of the plurality of main bodies 200, 200a, 200b and 200c.

The chamber body 100 may include a housing space capable of housing a process substance therein. For example, a cylindrical housing space may be formed inside the chamber body 100, but the present inventive concepts are not limited thereto. The housing space formed inside the chamber body 100 may also have a polygonal pillar shape.

A substrate support 120 may be formed on a bottom surface of the chamber body 100, and a substrate that can be used in the manufacturing process of the semiconductor device, the display device, the PCB or the like may be disposed on the substrate support 120. For example, a wafer may be disposed on the substrate support 120.

Because the process substance (e.g., plasma substance) is housed inside the chamber body 100, and the process is performed, the chamber body 100 may be formed of a substance that does not react with the process substance (e.g., the plasma substance). The chamber body 100, for example, may be formed of metal. The chamber body 100, for example, may be formed of, for example, copper (Cu) or aluminum (Al), but the present inventive concepts are not limited thereto.

The plurality of view ports 110, 110a, 110b and 110c may be formed on one side wall of the chamber body 100. For example, the plurality of view ports 110, 110a, 110b and 110c may be formed on respective sides of the chamber body 100. Although the chamber body 100 is illustrated to have a square pillar shape in FIG. 6, the present inventive concepts re not limited thereto, and the chamber body 100 may be formed in a different shape.

Further, the plurality of view ports may be formed only on one set of opposite sides of the chamber body 100, rather than being formed on all respective sides of the chamber body 100. That is, only the view port 110 and the view port 110b may be formed, and the view port 110 and the view port 110c may not be formed. When the view ports 110 and 110b are formed on the opposite sides of the chamber body 100, the installation costs of the sensing device may be reduced or prevented from excessively increasing, while enlarging the monitoring region through the sensing device installed in the view ports 110 and 110b.

The plurality of view ports 110, 110a, 110b and 110c, for example, may be formed of quartz or sapphire, but the present inventive concepts are not limited thereto. Each of the plurality of view ports 110, 110a, 110b and 110c may be installed inside one side wall of the chamber body 100 as a separate configuration from of the chamber body 100.

The plurality of main bodies 200, 200a, 200b and 200c may be disposed to be inserted into the plurality of view ports 110, 110a, 110b and 110c, respectively. Each of the plurality of main bodies 200, 200a, 200b and 200c may be formed in a cylindrical shape. In the case that each of the plurality of view ports 110, 110a, 110b and 110c is formed in a cylindrical shape, and each of the plurality of main bodies 200, 200a, 200b and 200c may be formed in the cylindrical shape so that they can be inserted into the plurality of view ports 110, 110a, 110b and 110c, respectively.

Figure 8:
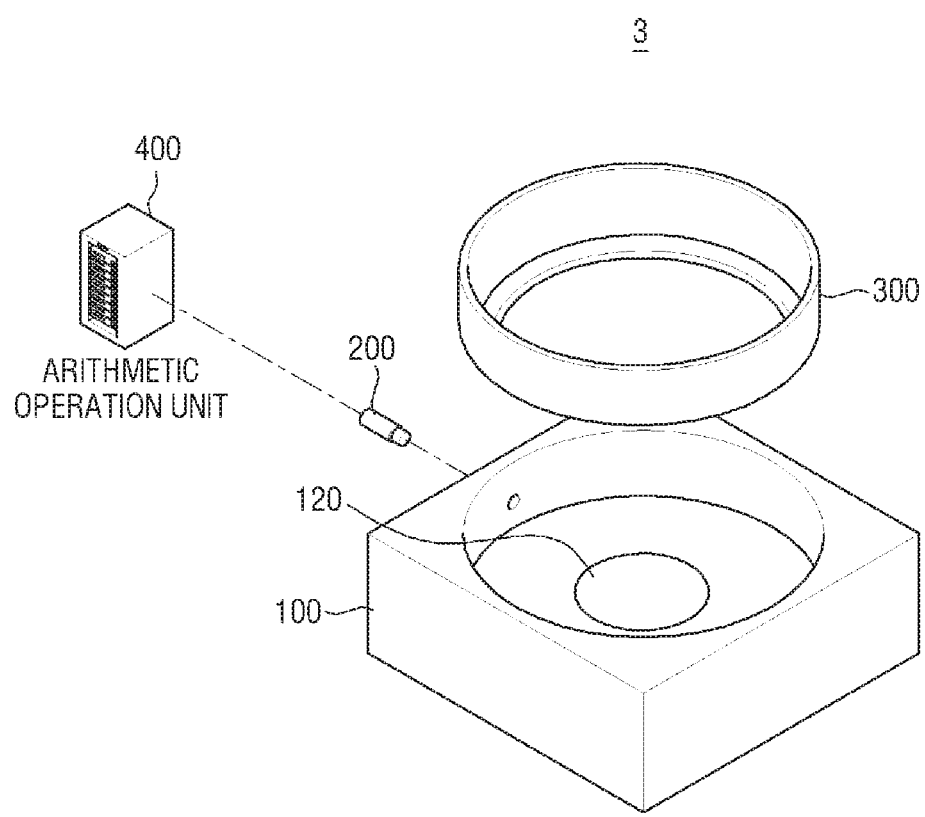
FIG. 8 is an exploded perspective view of the apparatus for monitoring the process chamber according to an example embodiment of the present inventive concepts.

FIG. 8 is an exploded perspective view of an apparatus for monitoring the process chamber according to an example embodiment of the present inventive concepts. For convenience of explanation, the description of the substantially same parts as the aforementioned apparatus for monitoring the process chamber will not be provided.

Referring to FIG. 8, an apparatus 3 for monitoring a process chamber includes a chamber body 100, a view port 110, a substrate support 120, a main body 200, a liner 300, an arithmetic operation unit 400.

The chamber body 100, the view port 110, the substrate support 120, the main body 200 and the liner 300 are substantially the same as those described above.

The arithmetic operation unit 400 is connected to a sensing device in the main body 200 to transmit and receive to and from the sensing device. The arithmetic operation unit 400 may perform a transformation operation on the result, which is obtained by monitoring the internal process status of the chamber body 100 in the sensing device 100 of the main body 200, to obtain the process status at the surface level of the substrate disposed on the substrate support 120. In some example embodiments, the arithmetic operation unit 400 may perform the transformation operation on the monitoring result of the sensing device using the Abel transformation and obtain the data about the process status at the substrate surface level.

The arithmetic operation unit 400 may perform the transformation operation using the aforementioned [Formula 1] and [Formula 2]. However, the operation of the operation unit 400 is not limited thereto, and the transformation operation of the arithmetic operation unit 400 may be performed using various algorithms.

Figure 9:
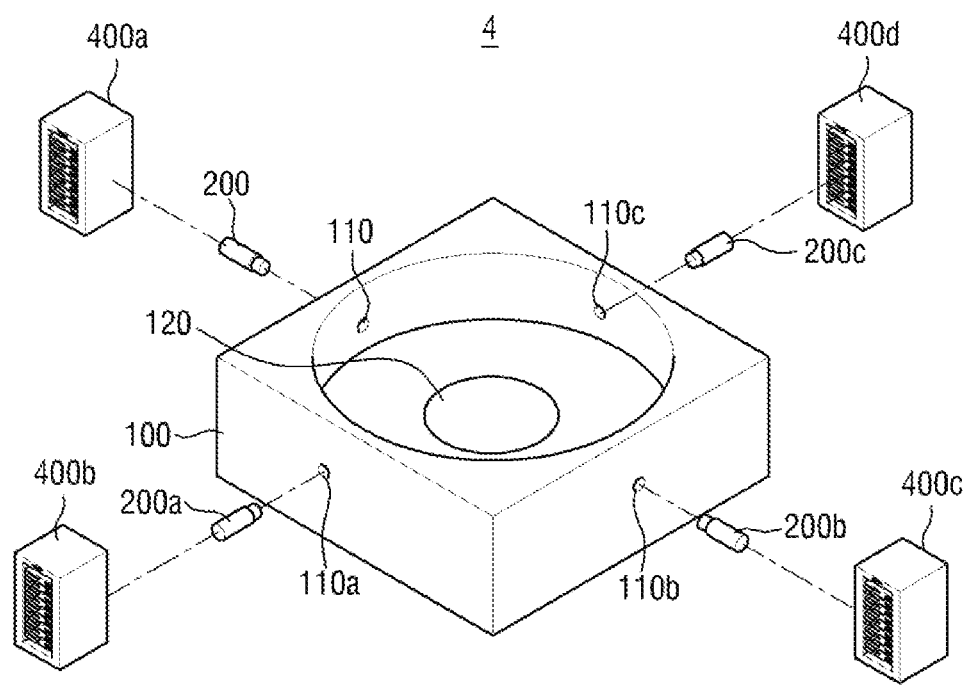
FIG. 9 is a perspective view of the apparatus for monitoring the process chamber according to an example embodiment of the present inventive concepts.

FIG. 9 is a perspective view of the apparatus for monitoring the process chamber according to an example embodiment of the present inventive concepts. For convenience of explanation, the description of the parts substantially the same as the aforementioned apparatus for monitoring the process chamber will not be provided.

Referring to FIG. 9, an apparatus 4 for monitoring a process chamber includes a chamber body 100, a plurality of view ports 110, 110a, 110b and 110c, a substrate support 120, a plurality of main bodies 200, 200a, 200b and 200c, first to fourth arithmetic operation units 400a, 400b, 400c and 400d.

The chamber body 100, the plurality of view ports 110, 110a, 110b and 110c, the substrate support 120, and the plurality of main bodies 200, 200a, 200b and 200c are substantially the same as those described above.

The first to fourth arithmetic operation units 400a, 400b, 400c and 400d may be connected to each other to transmit and receive data to and from sensing devices in the plurality of main bodies 200, 200a, 200b and 200c, respectively.

The first arithmetic operation unit 400a may perform a transformation operation on the result obtained by monitoring the internal process status of the chamber body 100 in the sensing device of the main body 200 to obtain process status information at the surface level of the substrate disposed on the substrate support 120. In some example embodiments, the first arithmetic operation unit 400a may perform the transformation operation of the monitoring results on the sensing device using the Abel transformation to achieve data about the process status at the substrate surface level.

The second arithmetic operation unit 400b may perform a transformation operation on the result obtained by monitoring the internal process status of the chamber body 100 in the sensing device of the main body 200a to obtain process status information at the surface level of the substrate disposed on the substrate support 120. In some example embodiments, the second arithmetic operation unit 400b may perform the transformation operation on the monitoring results of the sensing device using the Abel transformation and achieve data about the process status at the substrate surface level.

The third arithmetic operation unit 400c may perform a transformation operation on the result obtained by monitoring the internal process status of the chamber body 100 in the sensing device of the main body 200b to obtain the process status at the surface level of the substrate disposed on the substrate support 120. In some example embodiments, the third arithmetic operation unit 400c may perform the transformation operation on the monitoring results of the sensing device using the Abel transformation to obtain data about the process status at the substrate surface level.

The fourth arithmetic operation unit 400d may perform a transformation operation on the result obtained by monitoring the internal process status of the chamber body 100 in the sensing device of the main body 200c to obtain the process status at the surface level of the substrate disposed on the substrate support 120. In some example embodiments, the fourth arithmetic operation unit 400d may perform the transformation operation on the monitoring results of the sensing device using the Abel transformation to obtain data about the process status at the substrate surface level.

Each of the first to fourth arithmetic operation units 400a, 400b, 400c and 400d may perform the transformation operation, using the aforementioned [Formula 1] and [Formula 2]. However, the present inventive concepts are not limited thereto. In some example embodiments, some of the first to fourth arithmetic operation units 400a, 400b, 400c and 400d may perform the transformation operation using the different algorithms to each other. In some other example embodiments, only some of the fourth arithmetic operation units 400a, 400b, 400c and 400d may perform the transformation operation using the same algorithm.

The foregoing first to fourth transformation operations may be performed by using a memory configured to store computer-readable instructions and one or more processors configured to execute the computer-readable instructions.

Further, the sensing devices in the plurality of main bodies 200, 200a, 200b and 200c may be sense different regions from one another. First to fourth CCD sensors may be included within each of the plurality of main bodies 200, 200a, 200b and 200c, respectively. The first to fourth CCD sensors may have different focal lengths and may have different sensing regions from one another.

Further, first to fourth arithmetic operation units 400a, 400b, 400c and 400d may be formed by a single integrated system rather than being formed by distributed elements that are physically separated from each other. In some example embodiments, the first to fourth arithmetic operation units 400a, 400b, 400c and 400d may perform the aforementioned transformation operations in a single arithmetic operation unit by receiving a provision of monitoring results from all the sensing devices in the plurality of main bodies 200, 200a, 200b and 200c.

Figure 10:
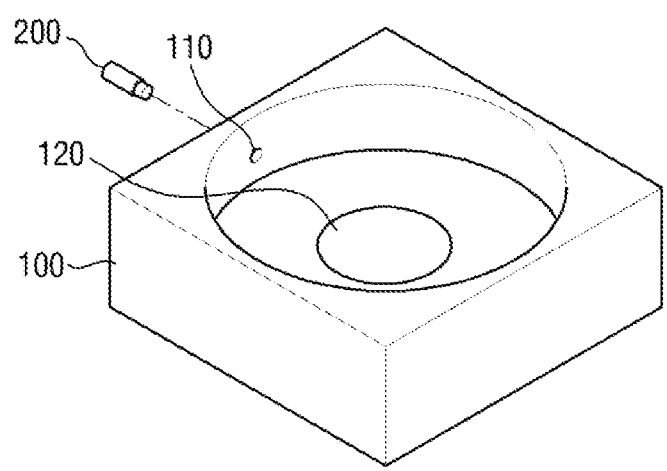
FIG. 10 is a perspective view of the apparatus for monitoring the process chamber according to an example embodiment of the present inventive concepts.
Figure 11:
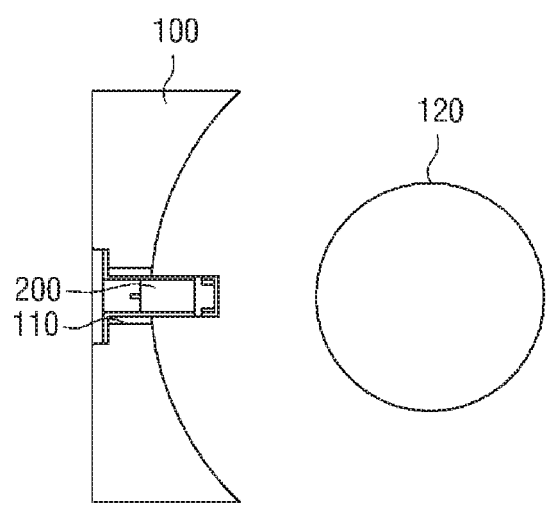
FIG. 11 is a partial sectional view of the apparatus for monitoring the process chamber according to an example embodiment of the present inventive concepts.

FIG. 10 is a perspective view of the apparatus for monitoring the process chamber according to an example embodiment of the present inventive concepts. FIG. 11 is a partial sectional view of the apparatus for monitoring the process chamber according to an example embodiment of the present inventive concepts. For convenience of explanation, the description of the substantially same parts as the aforementioned apparatus for monitoring the process chamber will not be provided.

Referring to FIGS. 10 and 11, an apparatus 5 for monitoring a process chamber includes a chamber body 100, a view port 110, a substrate support 120, and a main body 200.

The chamber body 100, the view port 110, the substrate support 120 and the main body 200 are the same as or substantially similar to those described above.

The apparatus 5 for monitoring the process chamber does not include the liner 300 as compared to the apparatus 1 for monitoring the process chamber of FIG. 1. That is, the main body 200 may be formed to protrude onto the inner wall of the chamber body 100, while being inserted into the view port 110.

The main body 200 may be formed in a cylindrical shape. That is, a part of the view port 110 may be formed in a cylindrical shape, and the main body 200 may be formed in a shape similar to the view port 110 so as to be inserted into the view port 110.

However, because the portion of the main body 200 that protrudes onto an inner wall of the chamber body 100 is exposed to the process substance or the process gas flowing into the chamber body 100, the portion may be formed of a material that does not react with the process substance or the process gas flowing into the chamber body 100.

For example, the main body 200 may be formed of metal. The main body 200, for example, may be formed of copper (Cu) or aluminum (Al), but the present inventive concepts are not limited thereto.

Figure 12:
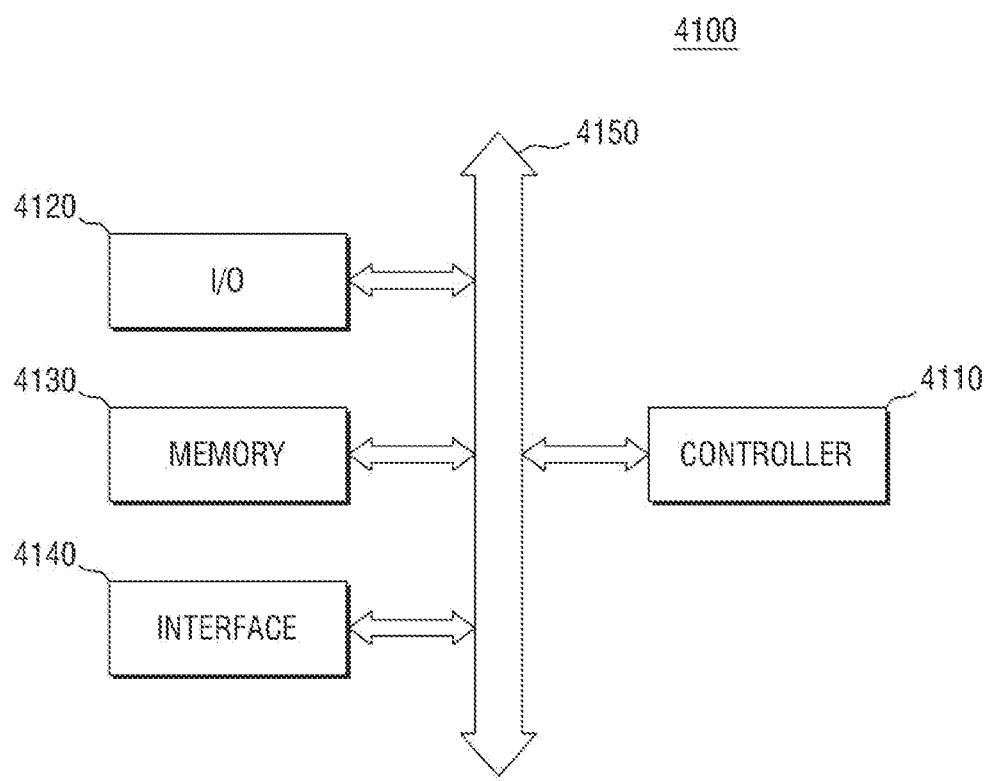
FIG. 12 is a block diagram of an electronic system that includes a semiconductor device manufactured using the apparatus for monitoring the process chamber according to an example embodiment of the present inventive concepts.

FIG. 12 is a block diagram of an electronic system that includes a semiconductor device manufactured using the apparatus for monitoring the process chamber according to an example embodiment of the present inventive concepts.

Referring to FIG. 12, an electronic system 4100 according to an example embodiment of the present inventive concepts includes a controller 4110, an input/output (I/O) device 4120, a memory device 4130, an interface 4140 and a bus 4150.

The controller 4110, the input/output (I/O) device 4120, the memory device 4130 and/or the interface 4140 may be coupled to one another through the bus 4150. The bus 4150 corresponds to a path through which the data are moved.

The controller 4110 may include at least one of a microprocessor, a digital signal processor, a microcontroller and logic devices capable of performing functions similar to these devices.

The I/O device 4120 may include a keypad, a keyboard, a display device and the like.

The memory device 4130 may store data and/or commands.

The interface 4140 may serve to transmit data to or receive data from a communication network. The interface 4140 may be a wired or wireless interface. For example, the interface 4140 may include an antenna or a wired or wireless transceiver.

Although it is not illustrated, the electronic system 4100 may also include a high-speed DRAM or SRAM, as an operating memory for improving the operation of the controller 4110. The semiconductor device according to the embodiment of the present inventive concepts may be provided in the memory device 4130 or may be provided as a part of the controller 4110, the I/O device 4120 and the like.

The electronic system 4100 may be applied to a personal digital assistant (PDA), a portable computer, a web tablet, a wireless phone, a mobile phone, a digital music player, a memory card or all types of electronic products capable of transmitting or receiving information in a wireless environment.

Figure 13:
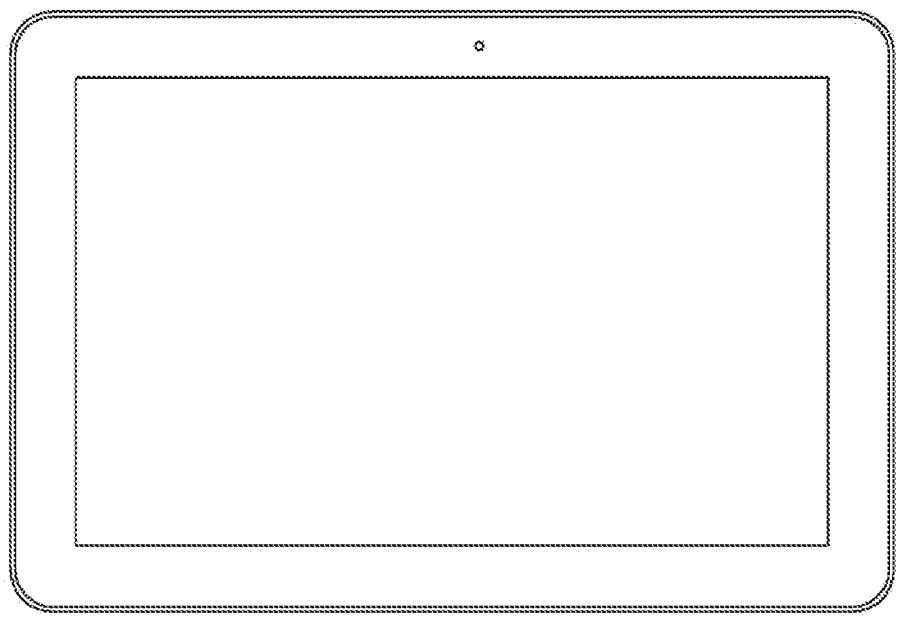
FIGS. 13 and 14 are exemplary semiconductor systems to which the semiconductor device manufactured using the apparatus for monitoring the process chamber according to some example embodiments of the present inventive concepts is applicable.
Figure 14:
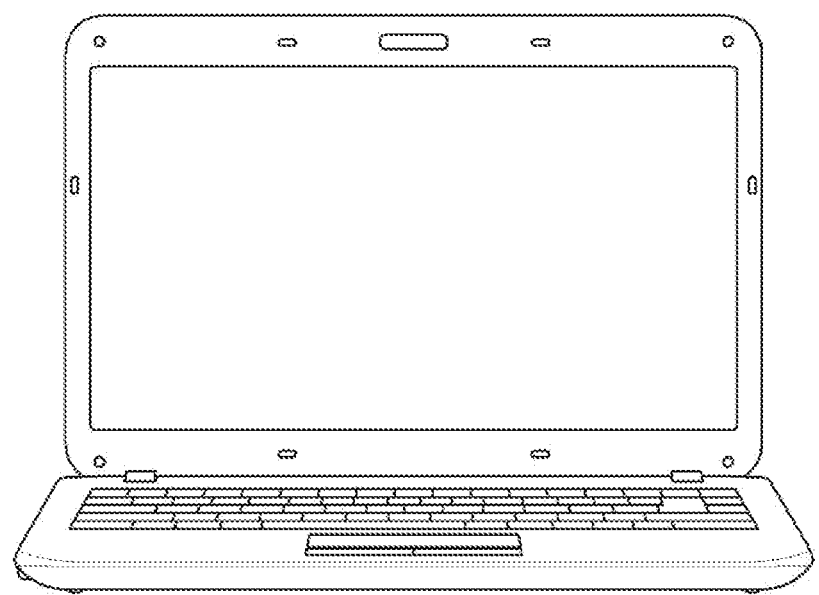

FIGS. 13 and 14 are diagrams illustrating examples of a semiconductor system to which the semiconductor device manufactured using the apparatus for monitoring the process chamber according to some example embodiments of the present inventive concepts is applicable.

FIG. 13 illustrates a tablet PC. FIG. 14 illustrates a laptop computer. The semiconductor device manufactured using the apparatus for monitoring the process chamber according to some example embodiments of the present inventive concepts may be used in the tablet PC, the laptop computer and the like. It is obvious to a person skilled in the art that the semiconductor device manufactured using the apparatus for monitoring the process chamber according to example embodiments of the present inventive concepts may also be applied to IC devices other than those set forth herein.

While the present inventive concepts have been particularly illustrated and described with reference to some example embodiments thereof, it will be understood by those of ordinary skill in the art that various changes in form and detail may be made therein without departing from the spirit and scope of the present inventive concepts as defined by the following claims. The example embodiments disclosed herein should be considered in a descriptive sense only and not for purposes of limitation.

What is claimed is:
1. A sensor assembly comprising:
a sensor module configured to monitor a process status of a process chamber, the sensor module including,
a cover section including a pinhole, the cover section having a first length in a direction toward a center of the process chamber, a sensor configured to monitor a first region at an interior of the process chamber determined based on the first length through the pinhole, and a main body including a fixing section and an insertion section, the fixing section configured to removably support the sensor, and the insertion section configured to be coupled to the cover section, wherein the cover section is configured to protrude from an inner wall of the process chamber and extend toward a center of the process chamber from a position at which an inner wall of a liner is provided.

2. The sensor assembly of claim 1, wherein a sensing angle of the sensor is arc tan (a/b)/π×180×2°, where "a" denotes a radius of a wafer disposed in the process chamber and "b" denotes a distance from the center of the process chamber to the pinhole.

3. The sensor assembly of claim 2, wherein a distance D between the pinhole and an end portion of the sensor facing the pinhole is (b×L)/(a×2), where "L" denotes a width of the sensor.

4. The sensor assembly of claim 1, further comprising:
a processor configured to perform a transformation operation on a result of monitoring the interior of the process chamber to obtain the process status.

5. The sensor assembly of claim 4, wherein the processor is configured to perform the transformation operation using an Abel transformation.

6. The sensor assembly of claim 1, further comprising:
a view port fixing section configured to be affixed into a view port defined in the process chamber.

7. The sensor assembly of claim 6, wherein the main body further includes a coupling section configured to be coupled the view port fixing section.

8. The sensor assembly of claim 6, wherein
the view port is adjacent to the inner wall of the process chamber, and
the cover section is configured to correspond to one end portion of the view port.

9. A method for fabricating a semiconductor device, the method comprising:
performing a plasma process on a substrate in a process chamber;
monitoring, by at least one image pickup unit penetrating a side wall of the process chamber, a distribution status of a process substance in the process chamber, the at least one image pickup unit including a cover, a sensor and a main body, the cover including a pinhole, the sensor configured to change a monitoring region in the process chamber through the pinhole by adjusting a focal distance thereof, the main body configured to removably support the sensor on a first side and be coupled to the cover on a second side opposite to the first side; and
obtaining, by at least one processor, a density distribution of the process substance in the process chamber, by performing at least one arithmetic operation using monitoring results from the at least one image pickup unit,
wherein the at least one image pickup unit is configured to be inserted into an inner wall of the process chamber, and
wherein the cover is configured to protrude from the inner wall of the process chamber and extend toward a center of the process chamber from a position at which an inner wall of a liner is provided.

10. The method of claim 9, wherein the sensor comprises a CCD sensor or a CMOS sensor.

11. The method of claim 9, wherein the at least one image pickup unit comprises:
a first CCD sensor on a first side of the process chamber; and
a second CCD sensor on a second side of the process chamber, the second side being opposite to the first side.

12. The method of claim 11, wherein the first CCD sensor has a first focal distance, the second CCD sensor has a second focal distance, and the first focal distance and the second focal distance are different from each other.

13. The method of claim 9, wherein the process chamber comprises a view port penetrating the side wall of the process chamber.

14. The method of claim 13, wherein the at least one image pickup unit is configured to be affixed to the view port.

15. The sensor assembly of claim 1, wherein the cover section has a hollow pillar shape, of which one end is closed and the other end is open, and the pinhole is provided at the one end.

16. The sensor assembly of claim 1, wherein the main body further comprises a coupling section configured to be inserted and affixed into a view port fixing section configured to be coupled to a hole penetrating through a wall of the process chamber.

17. The sensor assembly of claim 16, wherein the fixing section and the coupling section correspond to respective portions of an integral structure and the insertion section is configured to be detachably coupled to the integral structure.

18. The method of claim 9, wherein the cover has a hollow pillar shape, of which one end is closed and the other end is open, and the pinhole is provided at the one end.

19. The method of claim 9, wherein the adjusting the focal distance of the sensor includes adjusting the focal distance of the sensor based on one of a first length of the cover in a direction toward the center of the process chamber or a first distance between the pinhole and the sensor.

20. The method of claim 9, wherein the main body comprises a fixing section and an insertion section, the fixing section configured to removably support the sensor at the first side, and the insertion section configured to be coupled to the cover on the second side.

* * * * *